(12) United States Patent
Daikoku

(10) Patent No.: US 11,194,089 B2
(45) Date of Patent: Dec. 7, 2021

(54) METHOD FOR MANUFACTURING LIGHT EMITTING MODULE

(71) Applicant: NICHIA CORPORATION, Anan (JP)

(72) Inventor: Shinichi Daikoku, Tokushima (JP)

(73) Assignee: NICHIA CORPORATION, Anan (JP)

(*) Notice: Subject to any disclaimer, the term of this patent is extended or adjusted under 35 U.S.C. 154(b) by 18 days.

(21) Appl. No.: 16/535,530

(22) Filed: Aug. 8, 2019

(65) Prior Publication Data

US 2020/0057190 A1    Feb. 20, 2020

(30) Foreign Application Priority Data

Aug. 16, 2018    (JP) .............................. JP2018-153146

(51) Int. Cl.
*H01L 33/50*    (2010.01)
*H01L 33/60*    (2010.01)
(Continued)

(52) U.S. Cl.
CPC ......... *G02B 6/0065* (2013.01); *G02B 6/0073* (2013.01); *G02B 6/0091* (2013.01);
(Continued)

(58) Field of Classification Search
CPC .. G02B 6/0065; G02B 6/0073; G02B 6/0091; G02B 6/0021; H01L 33/62; H01L 33/52;
(Continued)

(56) References Cited

U.S. PATENT DOCUMENTS

2004/0222357 A1* 11/2004 King .................. H01L 24/95
250/214.1
2009/0305443 A1* 12/2009 Chang .................. H01L 33/52
438/26

(Continued)

FOREIGN PATENT DOCUMENTS

| JP | 2015032373 A | 2/2015 |
| JP | 2018133304 A | 8/2018 |
| KR | 20090117419 A | 11/2009 |
| WO | 2005119314 A2 | 12/2005 |

*Primary Examiner* — Kyoung Lee
(74) *Attorney, Agent, or Firm* — Hunton Andrews Kurth LLP

(57) ABSTRACT

A method for manufacturing a light emitting module including the steps of: preparing a light source including a light emitting element that has a pair of electrodes on the same surface side, and an encapsulation member that covers the light emitting element so as to expose a portion of a surface of the pair of electrodes; preparing a lightguide plate having a first primary surface to be a light emitting surface, and a second primary surface on an opposite side from the first primary surface, wherein the second primary surface has a recessed portion that has a bottom surface and at least one lateral surface; placing the light source on the bottom surface of the recessed portion with the electrodes facing up so as to be spaced apart from the lateral surface of the recessed portion; arranging a cover member that buries a gap between the lateral surface of the recessed portion and the light source and covers the light source including the electrodes; removing the cover member until the electrodes are exposed; and forming a metal film electrically connected to the light emitting elements.

17 Claims, 10 Drawing Sheets

(51) Int. Cl.
*F21V 8/00* (2006.01)
*H01L 33/62* (2010.01)
*H01L 33/52* (2010.01)

(52) U.S. Cl.
CPC ............ *H01L 33/507* (2013.01); *H01L 33/52* (2013.01); *H01L 33/60* (2013.01); *H01L 33/62* (2013.01); *H01L 2933/005* (2013.01); *H01L 2933/0066* (2013.01)

(58) Field of Classification Search
CPC . H01L 33/507; H01L 33/60; H01L 2933/005; H01L 2933/0066; H01L 25/0753; H01L 2933/0058; H01L 33/56; H01L 33/46
See application file for complete search history.

(56) References Cited

U.S. PATENT DOCUMENTS

| | | | |
|---|---|---|---|
| 2010/0265694 A1 | 10/2010 | Kim et al. | |
| 2012/0087103 A1* | 4/2012 | Dai | F21V 5/10 362/84 |
| 2015/0036317 A1 | 2/2015 | Yamamoto et al. | |
| 2015/0287892 A1* | 10/2015 | Han | F21K 9/232 257/89 |
| 2017/0005238 A1* | 1/2017 | Hung | H01L 24/19 |
| 2017/0102127 A1 | 4/2017 | Woodgate et al. | |
| 2018/0239193 A1 | 8/2018 | Hayashi | |

* cited by examiner

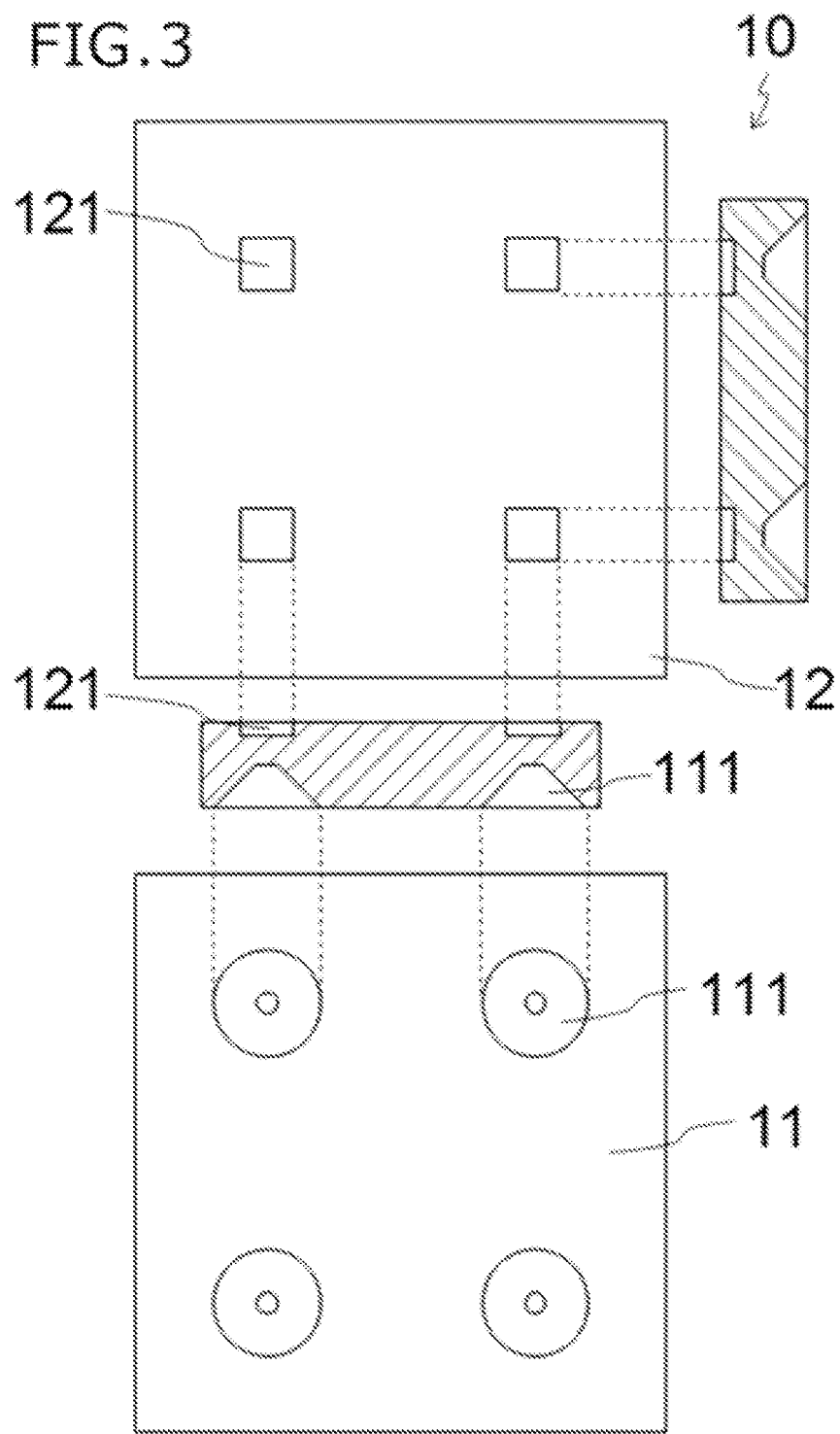

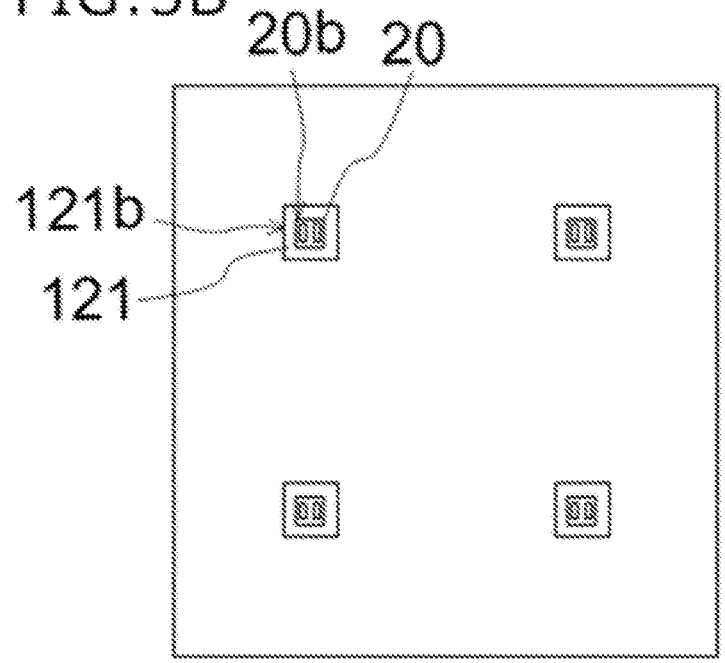
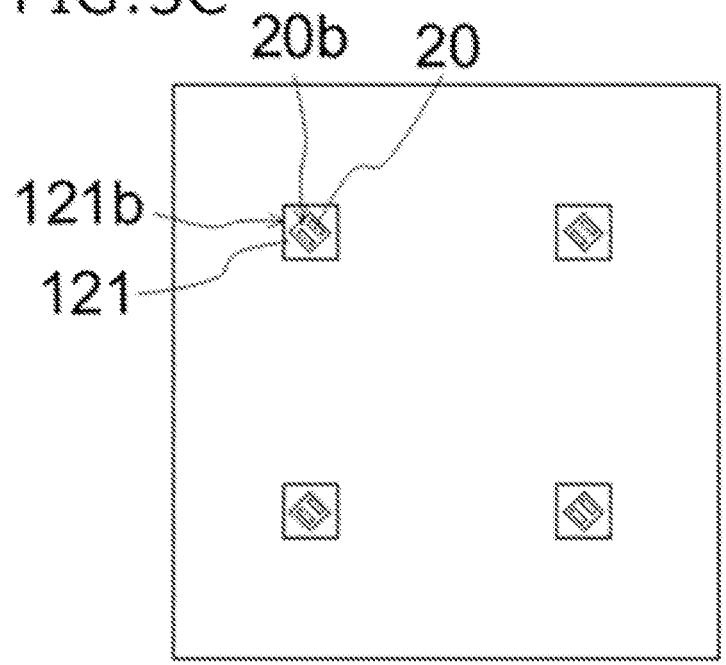

METHOD FOR MANUFACTURING LIGHT EMITTING MODULE

CROSS-REFERENCE TO RELATED APPLICATION

This application claims priority to Japanese Patent Application No. 2018-153146, filed on Aug. 16, 2018, the disclosure of which is hereby incorporated by reference in its entirety.

BACKGROUND

The present disclosure relates to a method of manufacturing a light emitting module.

Light emitting devices using light emitting elements such as light emitting diodes are widely used as backlights of liquid crystal displays and various light sources of displays, etc. For example, the light source device disclosed in Japanese Patent Publication No. 2015-32373 includes a plurality of light emitting elements mounted on a mounting substrate, semispherical lens members respectively covering the light emitting elements, and a diffusion member arranged thereabove upon which light from the light emitting elements is incident.

SUMMARY

However, with such a light source device as that of Japanese Patent Publication No. 2015-32373, the distance between the mounting substrate and the diffuser needs to be greater than the thickness of the lens member, and it may not be possible to achieve a sufficient thickness reduction.

In view of this, it is an object of the present disclosure to provide a light emitting module including a lightguide plate and light emitting elements of which the thickness can be reduced.

A method of manufacturing a light emitting module of an embodiment of the present disclosure includes the steps of: preparing a light source including a light emitting element that has a pair of electrodes on the same surface side, and an encapsulation member that covers the light emitting element so as to expose a portion of a surface of the pair of electrodes; preparing a lightguide plate having a first primary surface to be a light emitting surface, and a second primary surface on an opposite side from the first primary surface, wherein the second primary surface has a recessed portion that has a bottom surface and a lateral surface; placing the light source on the bottom surface of the recessed portion with the electrodes facing up so as to be spaced apart from the lateral surface of the recessed portion; arranging a cover member that buries a gap between the lateral surface of the recessed portion and the light source and covers the light source including the electrodes; removing the cover member until the electrodes are exposed; and forming a metal film electrically connected to the plurality of light emitting elements.

Thus, it is possible to provide a light emitting module that includes a lightguide plate and light emitting elements and that can be made thinner.

BRIEF DESCRIPTION OF THE DRAWINGS

FIG. 3 is a partial enlarged schematic plan view and a partial enlarged schematic lateral side view showing an example of an optical function portion and a recessed portion of a lightguide plate according to an embodiment of the present disclosure.

FIG. 5B is a partial enlarged schematic plan view showing a step in a method for manufacturing the light emitting module according to an embodiment of the present disclosure.

FIG. 5C is a partial enlarged schematic plan view showing a step in a method for manufacturing the light emitting module according to an embodiment of the present disclosure.

DETAILED DESCRIPTION

Embodiments of methods of manufacturing a light emitting module according to the present disclosure will be described in detail with reference to the drawings. Note that while terms indicating specific directions and positions (e.g., "upper", "lower", and other terms including such terms) are used as necessary in the description below, these terms are used for ease of understanding of the subject matter of the present disclosure with reference to the drawings, and the technical scope of the subject matter of the present disclosure is not limited by the meaning of these terms. Each part with the same reference sign appearing in different figures represents the same or equivalent part or member. Each member is denoted by the same name even if the state or shape thereof changes before and after it is cured or before and after it is cut, for example.

Moreover, the embodiment to be shown below is for illustrating a light emitting module that embodies the technical concept of the subject matter of the present disclosure, and it is not intended to limit the subject matter of the present disclosure to the description below. The size, material, shape, relative arrangement, etc., of the components described below are intended to be illustrative but not to limit the scope of the subject matter of the present disclosure thereto, unless otherwise specified. Descriptions used in one embodiment or example are applicable to other embodiments or other examples. The size, positional relationship, etc., of the members shown in each figure may be exaggerated in order to facilitate the understanding.

Embodiment 1

Figure 1A:
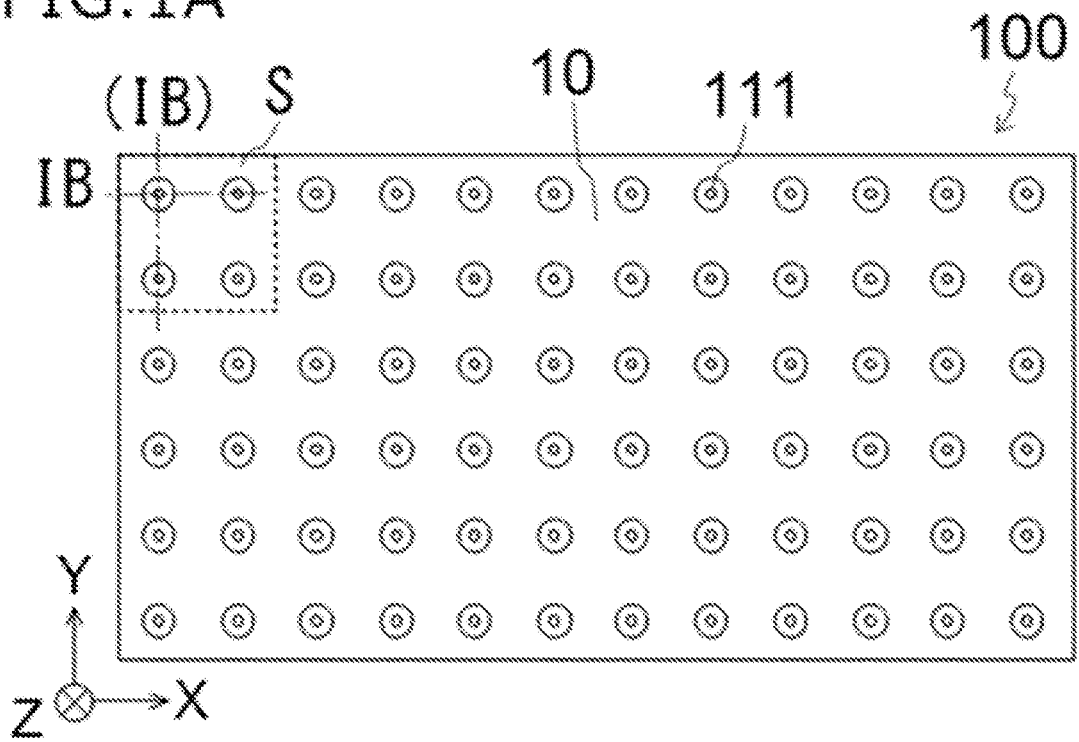
FIG. 1A is a schematic plan view of a light emitting module according to an embodiment of the present disclosure.
Figure 1B:
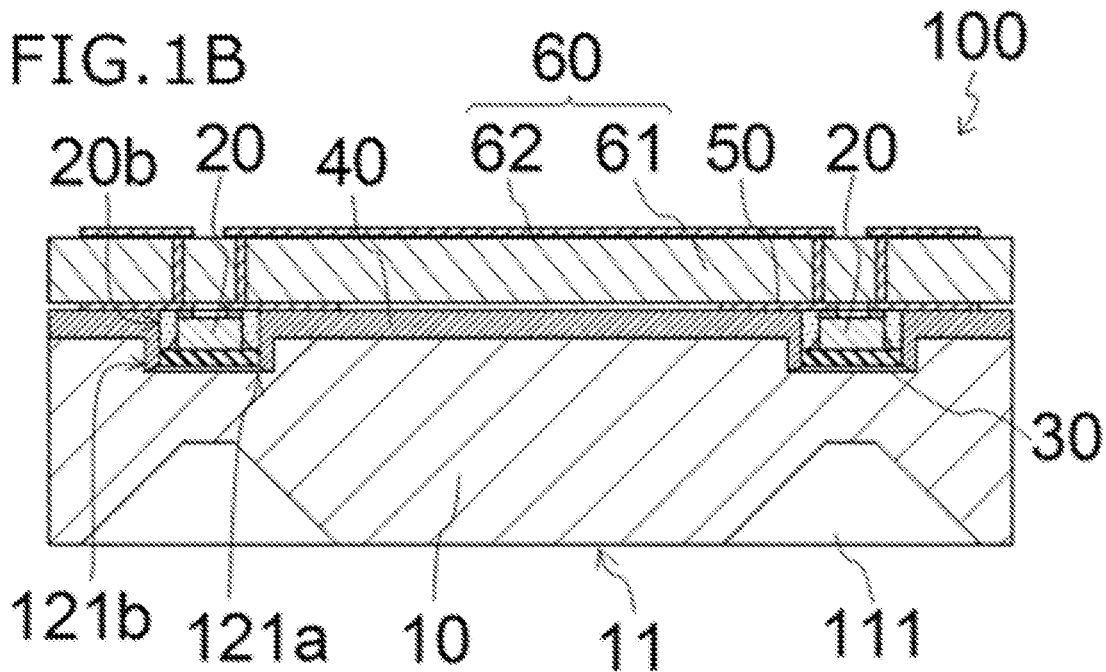
FIG. 1B is a partial enlarged schematic cross-sectional view of the light emitting module according to an embodiment of the present disclosure.

A configuration of a light emitting module of the present embodiment is shown in FIG. 1A and FIG. 1B.

FIG. 1A is a schematic plan view of a light emitting module 100 of the present embodiment. FIG. 1B is a partial enlarged schematic cross-sectional view showing the light emitting module 100 according to the present embodiment, showing a cross-sectional view taken along line IB (IB) of FIG. 1A.

The light emitting module 100 includes a lightguide plate 10, and a plurality of light sources 20 attached to the lightguide plate 10. The light sources 20 are arranged in a matrix pattern on a second primary surface 12 of the lightguide plate 10. The lightguide plate 10 of the light emitting module 100 includes a first primary surface 11, which is the light extraction surface, and the second primary surface 12 on an opposite side from the first primary surface 11. The lightguide plate 10 includes a plurality of recessed portions 121 on the second primary surface 12. Each light source 20 is attached on the bottom surface of a recessed portion 121 by an attachment member 30.

The light source 20 is spaced apart from the lateral surface 121b of the recessed portion 121. A cover member 40 is arranged between the lateral surface 121b of the recessed portion 121 and the lateral surface 20b of the light source 20. The cover member 40 also covers the second primary surface 12 of the lightguide plate 10. That is, the cover member 40 is arranged so as to extend continuously from the second primary surface 12 of the lightguide plate 10 to the inside of the recessed portion 121.

Such a light emitting module can be obtained by a manufacturing method including the following steps:

(1) preparing a light source including a light emitting element and an encapsulation member;

(2) preparing a lightguide plate having a first primary surface to be a light emitting surface and a second primary surface opposite to the first primary surface, wherein the second primary surface includes a recessed portion;

(3) placing the light source on a bottom surface of the recessed portion, with a pair of electrodes facing up, so as to be spaced apart from a lateral surface of the recessed portion;

(4) arranging a cover member that buries a gap between the lateral surface of the recessed portion and the light source, and covers the light source including the pair of electrodes;

(5) removing the cover member until the pair of electrodes are exposed; and (6) forming a metal film that is electrically connected to the light emitting element.

The light emitting module obtained by the method of the present disclosure can be made thinner because the light source is attached on the lightguide plate. Moreover, since light sources are placed and bonded on the lightguide plate, misalignment between the light sources or the light emitting elements and the lightguide plate is unlikely to occur as compared with a case where the light emitting module is formed by assembling together the lightguide plate and a substrate including light sources or light emitting elements placed thereon. Thus, it is possible to realize a light emitting module having good optical characteristics. Particularly, alignment may be easily achieved by providing recessed portions on the lightguide plate and placing the light sources in the recessed portions. Moreover, by providing the cover member in the gap between the lateral surface of the recessed portion and the lateral surface of the light source, it is possible to suppress light leakage to the second primary surface of the lightguide plate and the lateral surface of the recessed portion. This makes it easier for light to be propagated to the first primary surface 11 side.

Steps of a method for manufacturing the light emitting module 100 according to the present embodiment will now be described in detail. FIG. 2A to FIG. 8 show an example of a method of manufacturing a light emitting module of the present embodiment.

(1) Preparing a light source including a light emitting element and an encapsulation member.

The light source 20 is a light source of the light emitting module 100. A plurality of light sources 20 are attached to one lightguide plate 10. Necessary light sources 20 are provided, depending on the size or target optical characteristics of the light emitting module 100.

Figure 2A:
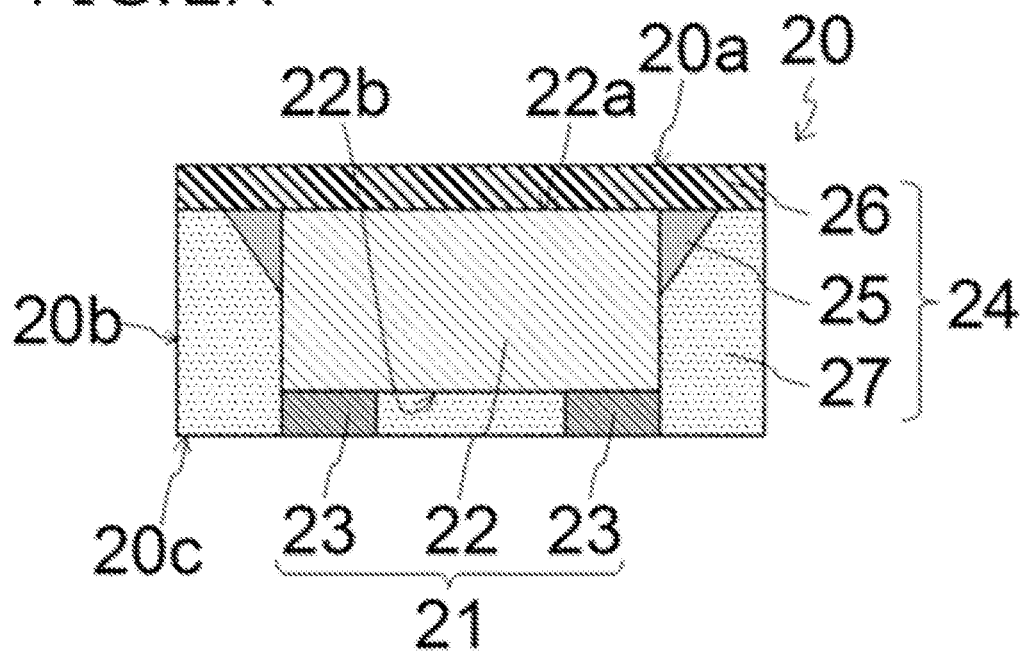
FIG. 2A is a schematic cross-sectional view showing an example of a light source of the light emitting module according to an embodiment of the present disclosure.
Figure 2B:
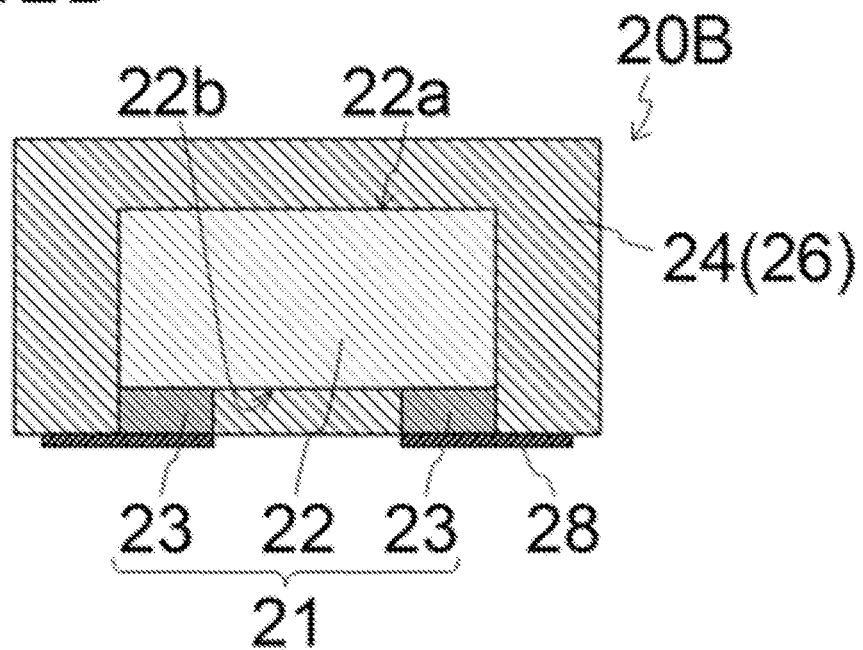
FIG. 2B is a schematic cross-sectional view showing an example of a light source of the light emitting module according to an embodiment of the present disclosure.

The light source 20 primarily includes a light emitting element 21 and an encapsulation member 24. FIG. 2A shows an example of the light source 20. The light emitting element 21 includes a layered semiconductor 22 including a semiconductor layer, and an electrode 23. The encapsulation member 24 covers the light emitting element 21 so that a portion of the electrode 23 is exposed. Note that a light source 20B shown in FIG. 2B is an example where a metal film 28 is provided on the surface of the electrode 23. The metal film 28 is provided for covering the surface of the electrode 23 exposed from the encapsulation member 24, and the metal film 28 is optional.

Such a light source 20 as described above can be provided through a part or whole of the manufacturing process for the light source 20, e.g., a step of manufacturing a light emitting element such as semiconductor growth, a step of forming the encapsulation member 24, etc. Alternatively, the light source 20 may be provided through purchase, or the like.

The light source 20 can be manufactured through steps shown in FIG. 2C to FIG. 2H, for example.

Figure 2C:
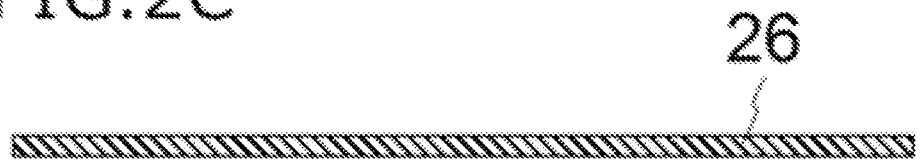
FIG. 2C is a partial enlarged schematic cross-sectional view showing a step in a method of manufacturing the light source.

FIG. 2C to FIG. 2H show an example of a method of manufacturing the light source 20. First, as shown in FIG. 2C, a flat plate-shaped light-transmitting member 26 is provided. The light-transmitting member 26 sized so that a plurality of light emitting elements 21 can be placed thereon is provided. For example, when the light emitting element 21 having a square shape of 500 μm×500 μm in a plan view is used, the light-transmitting member 26 of 60 mm×60 mm in a plan view can be used. Where the light-transmitting member 26 is a layered structure of a wavelength conversion member including a phosphor and a light-transmitting member including no phosphor, a layered light-transmitting member 26 is provided at this point.

Figure 2D:
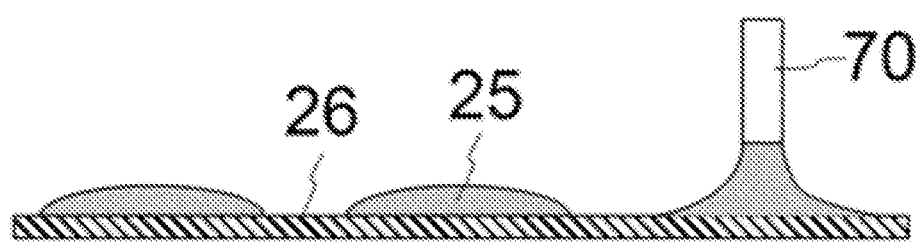
FIG. 2D is a partial enlarged schematic cross-sectional view showing a step in a method of manufacturing the light source.

Next, as shown in FIG. 2D, a plurality of lightguide members 25 are arranged on the light-transmitting member 26. The lightguide members 25 are each a light-transmitting member that attaches together the light-transmitting member 26 and the light emitting element 21. Examples of the method for arranging the lightguide members 25 include a method of dispensing liquid-form lightguide members 25 on the light-transmitting member 26 by using a dispense nozzle 70 as shown in FIG. 2D, for example. Alternatively, methods such as pin transfer and printing can be used. The lightguide members 25 are arranged so as to be spaced apart from each other.

Figure 2E:
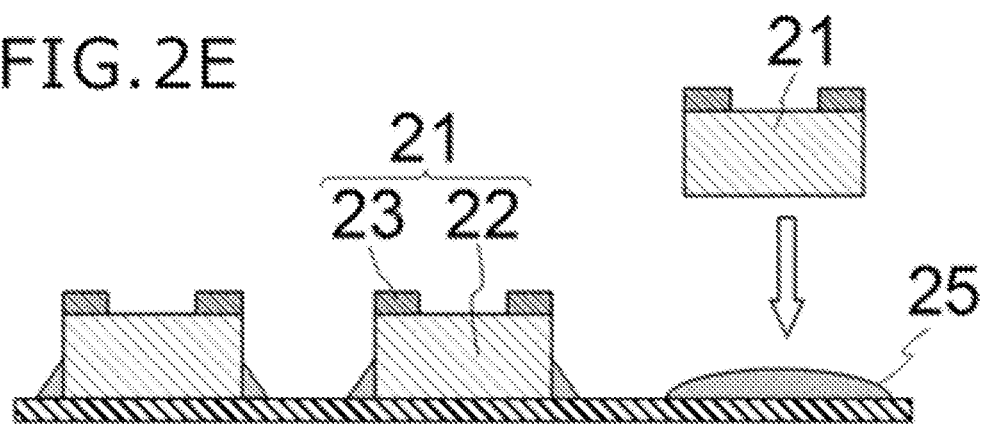
FIG. 2E is a partial enlarged schematic cross-sectional view showing a step in a method of manufacturing the light source.

Next, as shown in FIG. 2E, the light emitting elements 21 are placed on the lightguide members 25. In the process, the light emitting elements 21 are placed with the electrodes 23 thereof facing up. In other words, the light emitting elements 21 are placed so that the layered semiconductor 22 side (primary light emitting surface side) of the light emitting element 21 opposes the lightguide member 25. In this process, the lightguide member 25 may be in contact with the lateral surface of the light emitting element 21.

Figure 2F:
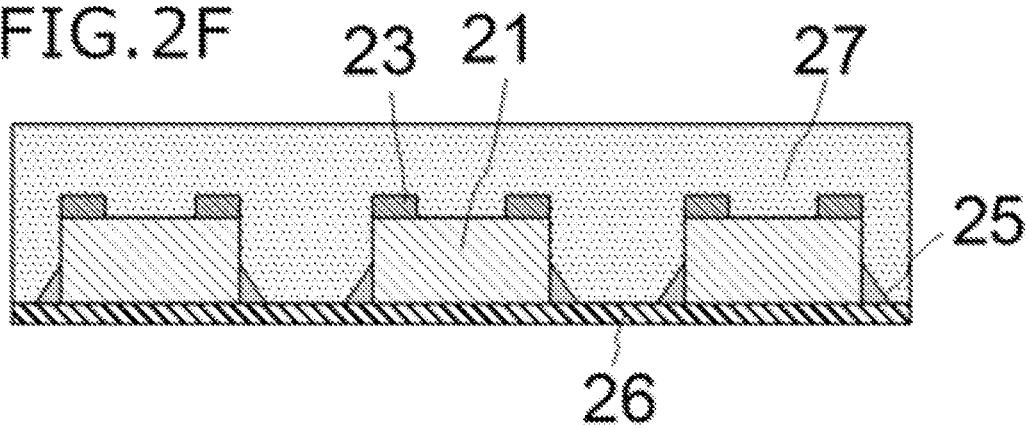
FIG. 2F is a partial enlarged schematic cross-sectional view showing a step in a method of manufacturing the light source.

Next, as shown in FIG. 2F, a reflective member 27 is arranged so as to bury the light emitting elements 21 and the lightguide members 25. It is preferred that the electrodes 23 of the light emitting elements 21 are also buried in the reflective member 27.

Figure 2G:
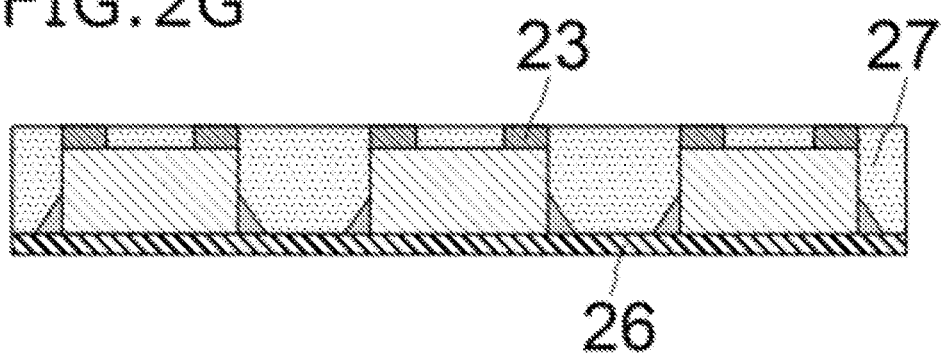
FIG. 2G is a partial enlarged schematic cross-sectional view showing a step in a method of manufacturing the light source.

Next, as shown in FIG. 2G, a surface portion of the reflective member 27 is removed, thereby exposing the electrodes 23 of the light emitting elements 21.

Figure 2H:
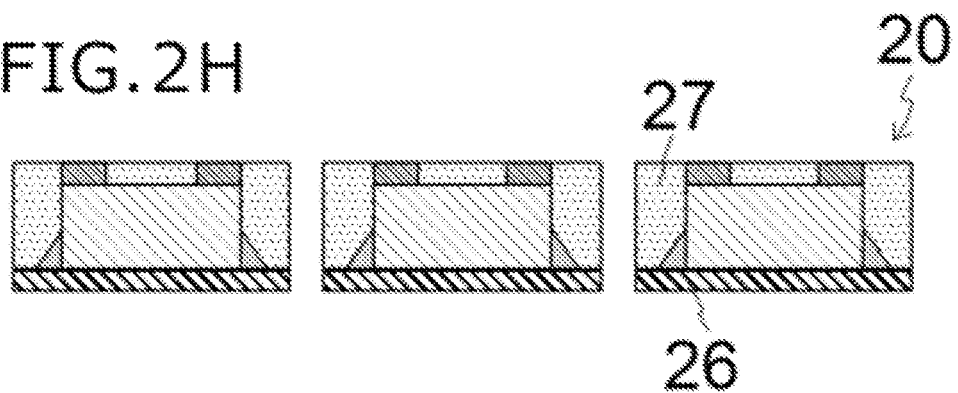
FIG. 2H is a partial enlarged schematic cross-sectional view showing a step in a method of manufacturing the light source.

Next, as shown in FIG. 2H, the reflective member 27 and the light-transmitting member 26 are cut off between adjacent light emitting elements 21, thereby obtaining severed pieces of the light sources 20.

(2) Preparing a lightguide plate having a first primary surface to be a light emitting surface and a second primary surface opposite to the first primary surface, wherein the second primary surface includes a plurality of recessed portions.

The lightguide plate 10 is provided. The lightguide plate 10 is a member for spreading light from the light sources 20 into planar light, and is a generally plate-shaped member that has the first primary surface 11, which is the light extraction surface, and the second primary surface 12 located opposite to the first primary surface 11.

FIG. 3 is an enlarged view of an area S of the lightguide plate 10 shown in FIG. 1A. The lightguide plate 10 includes a plurality of recessed portions 121 on the second primary surface 12, each having a generally square-shaped opening. Each recessed portion 121 is a portion in which the light source 20 is arranged. Since the light source 20 is arranged spaced apart from the lateral surface 121b of the recessed portion 121, the recessed portion 121 is larger than the light source 20 in a plan view. For example, the size of the opening of the recessed portion 121 may be larger than the size of the light source 20 in a plan view and smaller than 300% the area of the light source 20. Then, light may be efficiently propagated to the first primary surface side. The depth of the recessed portion 121 may be made generally equal to or less than the height of the light source 20. Then, light may be efficiently propagated to the first primary surface side.

The shape of the recessed portion 121 in a plan view may be a quadrangular shape such as a square shape or a rectangular shape, or a polygonal shape such as a triangular shape or a hexagonal shape. It may also be a circular shape, an elliptical shape, or the like.

Such a lightguide plate 10 may be provided through molding using injection molding, transfer molding, thermal transfer, etc., for example. Optical function portions 111 and the recessed portions 121 of the lightguide plate 10 may be formed at once through molding when molding the lightguide plate 10. Then, it is possible to reduce the molding misalignment of the optical function portions 111 and the recessed portions 121. Alternatively, the lightguide plate 10 may be provided by providing a plate with no recessed portions and no optical function portions and processing the plate. Alternatively, a lightguide plate 10 including recessed portions 121 and optical function portions 111 may be provided through purchase.

(3) Placing the light source on a bottom surface of each of the recessed portions, with a pair of electrodes facing up, so as to be spaced apart from a lateral surface of the recessed portion.

Figure 4:
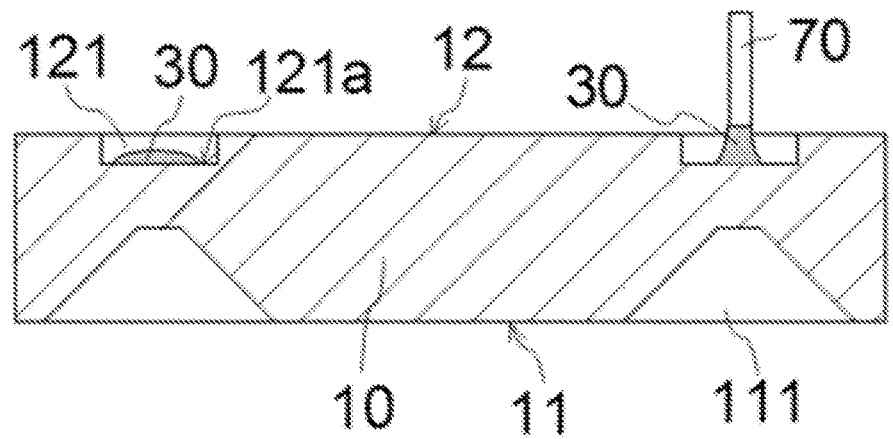
FIG. 4 is a partial enlarged schematic cross-sectional view showing a step in a method of manufacturing the light emitting module according to an embodiment of the present disclosure.

Next, as shown in FIG. 4, a liquid-form attachment member 30 is arranged on a bottom surface 121a of each recessed portion 121. The attachment member 30 may be applied by a method such as potting, transfer, printing, etc. FIG. 4 illustrates a case where the attachment members 30 are arranged through potting using the dispense nozzle 70. The attachment members 30 may be provided on the light source 20 side. For example, the light source 20 may be picked up by a suction member such as a suction collet, and the light emitting surface of the light source may be immersed in the liquid-form attachment member 30 so that the lightguide member 25 attaches thereto.

Figure 5A:
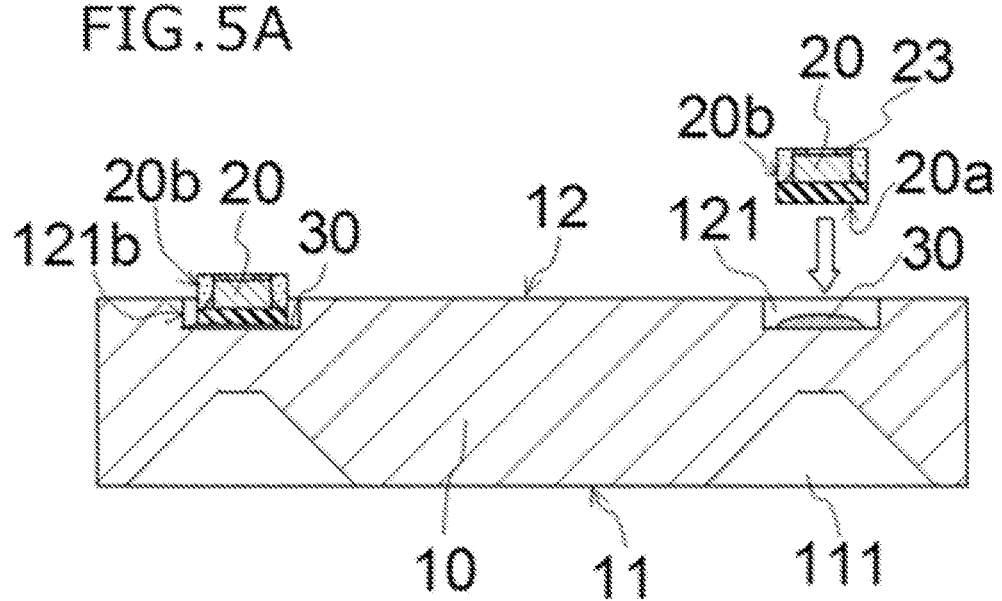
FIG. 5A is a partial enlarged schematic cross-sectional view showing a step in a method of manufacturing the light emitting module according to an embodiment of the present disclosure.

Next, as shown in FIG. 5A, the light source 20 may be placed on the attachment member 30 in each recessed portion 121. At this point, the light source 20 is placed with the electrode 23 facing up. That is, the light source 20 is placed on the recessed portion 121 with the electrode 23 facing up so that the light emitting surface 20a of the light source 20 and the attachment member 30 oppose each other. Moreover, they are preferably arranged so that the centers of the light sources 20 and the centers of the recessed portions 121 coincide with each other in a plan view.

The light source 20 is arranged so as to be spaced apart from the lateral surface 121b of the recessed portion 121. Specifically, the light source 20 is arranged so that a gap is formed between the lateral surface 20b of the light source 20 and the lateral surface 121b of the recessed portion 121. It is preferred that such a gap is formed so as to have an equal width at positions that are in symmetry with respect to the center of the light source 20 in a plan view, for example.

Where the recessed portion 121 has a square shape in a plan view and the light source 20 has a square shape in a plan view, the lateral surface 121*b* of the recessed portion 121 and the lateral surface 20*b* of the light source 20 can be arranged so as to be generally parallel to each other as shown in FIG. 5B. Then, it is preferred that the distance (width) between the lateral surface 20*b* of the light source 20 and the lateral surface 121*b* of the recessed portion 121 is generally equal along the entire circumference of the light source 20.

Where the recessed portion 121 has a square shape in a plan view and the light source 20 has a square shape in a plan view, they may be arranged so that the lateral surface 121*b* of the recessed portion 121 and the lateral surface 20*b* of the light source 20 are rotated by about 45 degrees relative to each other in a plan view as shown in FIG. 5C. That is, they are arranged so that the center of the lateral surface 121*b* of the recessed portion 121 and the corner portion of the light source 20 oppose each other in a plan view.

After placing the light sources 20 as described above, the attachment member 30 is allowed to cure, thereby attaching together the light sources 20 and the lightguide plate 10.

(4) Arranging a cover member that buries a gap between the lateral surface of the recessed portion and the light source, and covers the light source including the electrode.

Figure 6A:
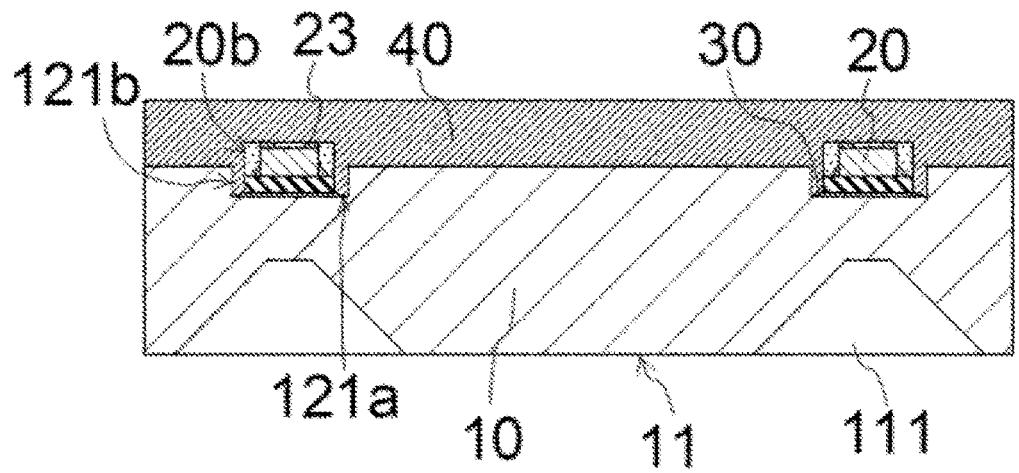
FIG. 6A is a partial enlarged schematic cross-sectional view showing a step in a method of manufacturing the light emitting module according to an embodiment of the present disclosure.

Next, as shown in FIG. 6A, the cover member 40 is formed that covers the second primary surface 12 of the lightguide plate 10 and the light sources 20. At this point, the cover member 40 is formed also in the gap between the lateral surface 121*b* of the recessed portion 121 and the lateral surface 20*b* of the light source 20. In other words, the cover member 40 is formed so as to be in contact with the lateral surface 20*b* of the light source 20 and the lateral surface 121*b* of the recessed portion 121. Moreover, the cover member 40 may be in contact with the attachment member 30. The cover member 40 may be in contact with the bottom surface 121*a* of the recessed portion 121.

The cover member 40 may be formed by a method such as transfer molding, potting, printing, spraying, etc., for example. In this process, the cover member 40 may be formed to be thick so as to completely cover the upper surfaces of the electrodes 23 of the light sources 20.

(5) Removing the cover member until the electrode is exposed.

Figure 6B:
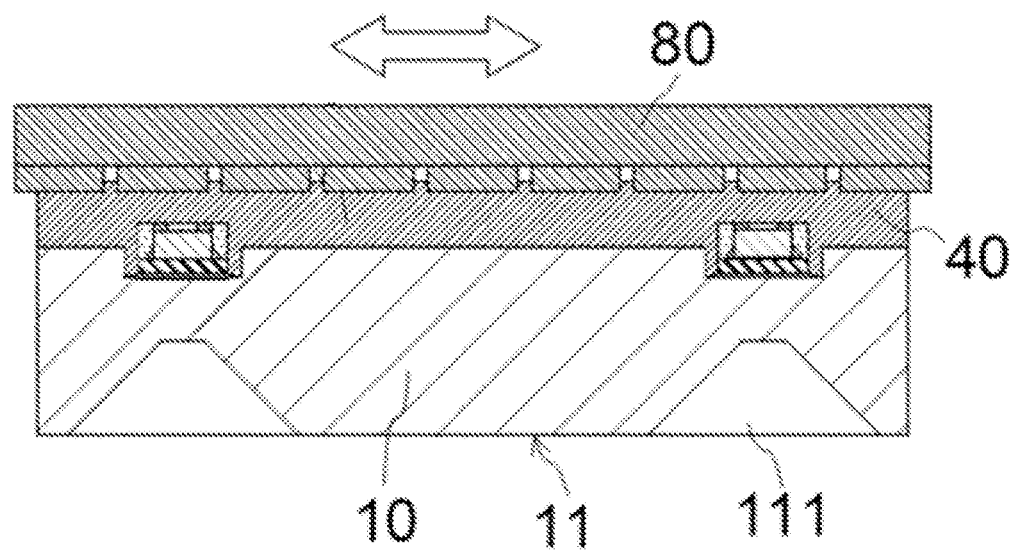
FIG. 6B is a partial enlarged schematic cross-sectional view showing a step in a method of manufacturing the light emitting module according to an embodiment of the present disclosure.
Figure 6C:
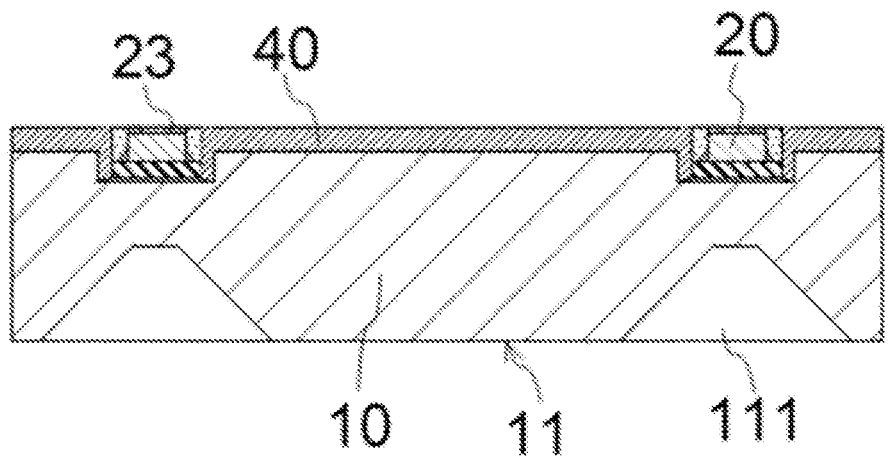
FIG. 6C is a partial enlarged schematic cross-sectional view showing a step in a method of manufacturing the light emitting module according to an embodiment of the present disclosure.

Next, as shown in FIG. 6B, the surface of the cover member 40 is ground across the entire surface thereof. Thus, as shown in FIG. 6C, the electrode 23 of the light source 20 is exposed from the cover member 40. As the method of grinding, the cover member 40 may be ground to a plane by using a grinder member 80 such as a grindstone. Note that when the light source 20 includes the metal film 28 connected to the electrode 23, the cover member 40 may be removed until the metal film 28 is exposed. In either case, the cover member 40 may be removed until a conductive member, which is capable of supplying electric power to the light emitting element 21 of the light source 20, is exposed.

(6) forming a metal film that is electrically connected to a plurality of light emitting elements.

Figure 7A:
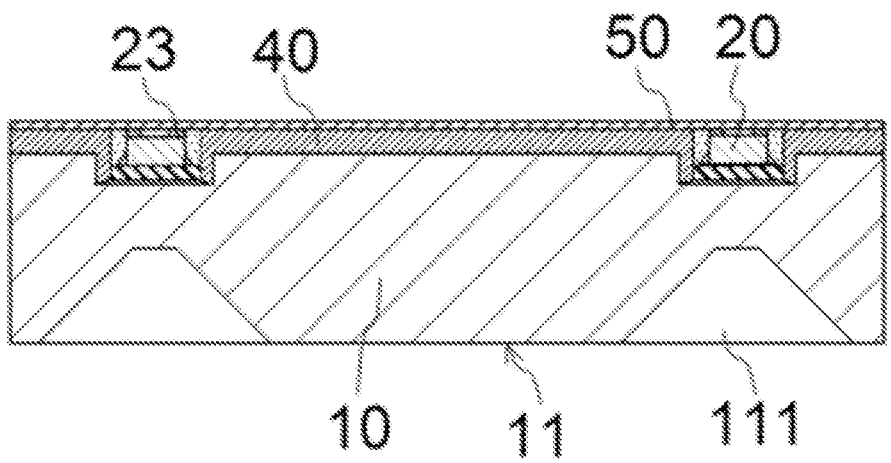
FIG. 7A is a partial enlarged schematic cross-sectional view showing a step in a method of manufacturing the light emitting module according to an embodiment of the present disclosure.

Next, as shown in FIG. 7A, a metal film 50 is formed across substantially the entire surface of the electrodes 23 of the light sources 20 and the cover member 40. The metal film 50 may have a layered structure including Cu/Ni/Au layered in this order starting from the lightguide plate 10 side, for example. The method of formation of the metal film 50 includes sputtering, plating, etc., and the metal film is preferably formed by sputtering.

Figure 7B:
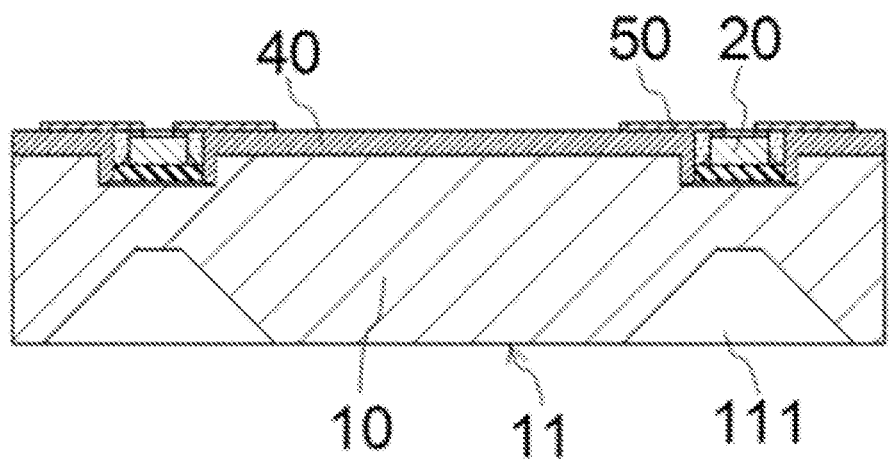
FIG. 7B is a partial enlarged schematic cross-sectional view showing a step in a method of manufacturing the light emitting module according to an embodiment of the present disclosure.

Next, the metal film 50 is patterned by laser abrasion by irradiating the metal film 50 with laser light and removing the irradiated portions of the metal film 50, thereby forming divided pieces of the metal film 50 as shown in FIG. 7B. The metal film 50 is electrically connected to the electrode 23 of the light source 20.

Figure 8:
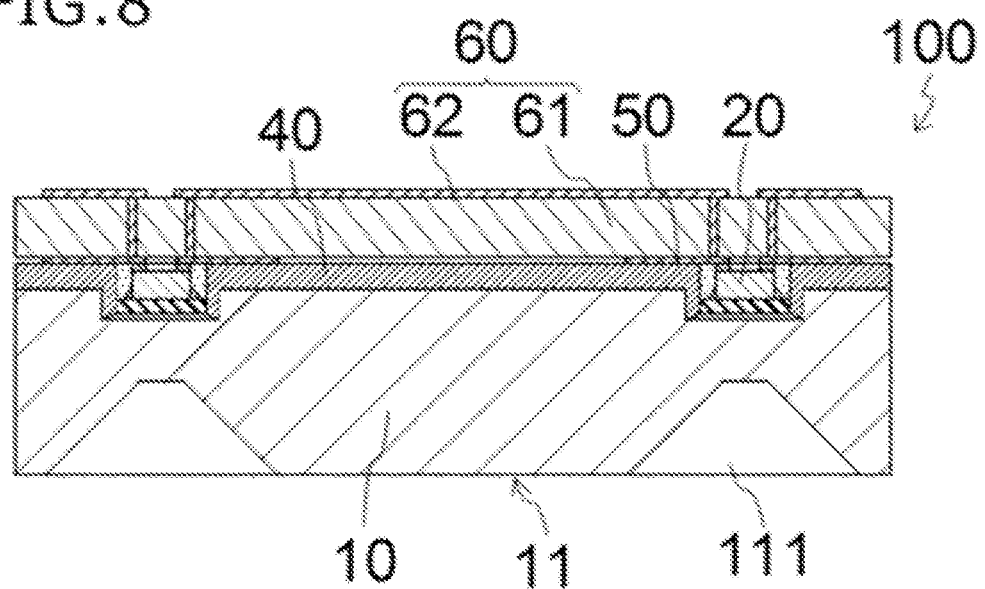
FIG. 8 is a partial enlarged schematic cross-sectional view showing a step in a method of manufacturing the light emitting module according to an embodiment of the present disclosure.

Next, as shown in FIG. 8, the metal film 50 and an interconnect 62 of an interconnect substrate 60, which is separately provided, are pressure-bonded together with an adhesive sheet, or the like, interposed therebetween. In this process, the metal film 50 and the interconnect 62 may be electrically connected to each other by partially melting, using pressure and heat, the conductive material, which fills portions (e.g., vias) of the interconnect 62.

Thus, the light emitting module 100 of the present embodiment can be obtained.

A plurality of light sources 20 can be wired together so that they can be driven independently of each other. The lightguide plate 10 may be divided into a plurality of areas, and the plurality of light sources 20 may be divided into a plurality of groups, wherein each group corresponds to one area of the lightguide plate 10 and includes light sources 20 that are mounted in the area, and light sources 20 in each group are electrically connected in series or in parallel together, thus resulting in a plurality of light source groups. With such grouping, it is possible to realize a light emitting module capable of local dimming.

One light emitting module 100 of the present embodiment may be used as the backlight of one liquid crystal display device. Alternatively, an array of light emitting modules 100 may be used as the backlight of one liquid crystal display device.

One light emitting module 100 may be attached to one interconnect substrate 60. Alternatively, a plurality of light emitting modules 100 may be attached to one interconnect substrate 60. Then, terminals (e.g., connectors) for electric connection to the outside can be conserved (i.e., no need to provide them for each light emitting module), making it possible to simplify the structure of the liquid crystal display device.

A plurality of interconnect substrates 60, each including a plurality of light emitting modules 100 attached thereto, may be arranged in an array to be the backlight of one liquid crystal display device. In such a case, for example, a plurality of interconnect substrates 60 can be placed on a frame, or the like, and each interconnect substrate 60 can be connected to an outside power supply using a connector, or the like.

Members of the light emitting module will now be described in detail.

(Light Source Member)

The light source 20 includes the light emitting element 21 and the encapsulation member 24. The encapsulation member 24 is a member that covers the surface of the light emitting element 21, and is primarily formed from a resin material. A portion of the encapsulation member 24 that covers a primary light emitting surface 22*a* of the light emitting element 21 is at least partially light-transmitting, and light is extracted through this light-transmitting portion to enter the lightguide plate. With the light source 20 including the encapsulation member 24 as described above, instead of being formed solely of the light emitting element 21, it is possible to improve the strength of the light emitting element 21. Thus, it is possible to stably perform the subsequent steps. Furthermore, when a wavelength conversion member is included in the encapsulation member 24, the color of emission of the light source 20 may be preadjusted to an intended chromaticity. Thus, it is possible to reduce the unevenness in emission color of the light emitting module 100.

A semiconductor light emitting element known in the art may be used as the light emitting element 21. In the present embodiment, a light emitting diode is illustrated as the light emitting element 21. The light emitting element 21 includes the layered semiconductor 22 having the primary light emitting surface 22a from which light emission is primarily extracted and an electrode formation surface 22b on an opposite side from the primary light emitting surface 22a, and includes a pair of electrodes 23 formed on the electrode formation surface 22b. The pair of electrodes 23 are arranged on the same surface side of the light emitting element 21 so as to oppose the interconnect substrate 60 to be described below, and are electrically connected to the interconnect 62 of the interconnect substrate 60 optionally with the metal film 50, or the like, interposed therebetween.

The light emitting element 21 includes the layered semiconductor 22 including a light-transmitting substrate of sapphire, or the like, and a semiconductor layer layered on the light-transmitting substrate, for example. The layered semiconductor 22 includes a light emitting layer, and an n-type semiconductor layer and a p-type semiconductor layer with the light emitting layer sandwiched therebetween, wherein an n-side electrode and a p-side electrode are electrically connected to the n-type semiconductor layer and the p-type semiconductor layer, respectively. For example, the light emitting element 21 has the primary light emitting surface 22a including the light-transmitting substrate, which is arranged so as to oppose the lightguide plate, and includes a pair of electrodes 23 on the electrode formation surface 22b opposite to the primary light emitting surface 22a.

The light emitting element 21 may be an element that emits light of any wavelength. For example, an element that emits blue light or green light may be a light emitting element that uses a nitride-based semiconductor ($In_xAl_yGa_{1-x-y}N$, $0 \leq X$, $0 \leq Y$, $X+Y \leq 1$) or GaP. An element that emits red light may be a light emitting element that includes a semiconductor such as GaAlAs or AlInGaP. Moreover, semiconductor light emitting elements made of other materials may be used. The emission wavelength can be selected from among various emission wavelengths based on the material and the crystal mix degree of the semiconductor layer. The composition, the color of emission, the size, the number, etc., of light emitting elements used may be selected appropriately depending on the purpose. When the light emitting module 100 includes a wavelength conversion member, it is preferred that the light emitting element 21 includes a nitride semiconductor ($In_xAl_yGa_{1-x-y}N$, $0 \leq X$, $0 \leq Y$, $X+Y \leq 1$) capable of emitting light of a short wavelength with which the wavelength conversion member can be excited efficiently.

For example, the size of the light emitting element 21 is preferably 1000 µm or less, more preferably 500 µm or less, and even more preferably 200 µm or less, along the x and y directions in a plan view. When such a light emitting element is used, it is possible to realize a high-definition image when local dimming of the liquid crystal display device is actuated.

The encapsulation member 24 can be formed of one light-transmitting member 26 that covers the entire surface of the light emitting element 21 as shown in FIG. 2B, for example. Alternatively, as shown in FIG. 2A, the encapsulation member 24 may be formed of a plurality of members including the light-transmitting member 26 that covers the primary light emitting surface 22a of the light emitting element 21 and the reflective member 27 that covers the lateral surface of the light emitting element 21.

In the example shown in FIG. 2A, the reflective member 27 also covers the electrode formation surface 22b of the light emitting element 21 so as to cover the electrode 23. In addition to these members, the encapsulation member 24 in the illustrated example further includes the lightguide member 25 that covers a portion of the lateral surface of the light emitting element 21 and is covered by the reflective member 27.

The light-transmitting member 26, which forms a portion of the encapsulation member 24, is light-transmitting such that it allows at least light from the light emitting element 21 pass therethrough, and transmits 60% or more, preferably 90% or more, of light emitted from the light emitting element 21. The material of the light-transmitting member 26 may be, for example, a light-transmitting thermosetting resin material, such as an epoxy resin, a silicone resin, or the like. The thickness of the light-transmitting member 26 is 100 µm to 200 µm, for example.

The light-transmitting member 26 may include a wavelength conversion member containing a phosphor that converts light from the light emitting element 21 into light of a different wavelength. For example, the entire light-transmitting member 26 may be a wavelength conversion member, or the light-transmitting member 26 may be a light-transmitting member having a layered structure of a light-transmitting member containing no phosphor and a light-transmitting member (a wavelength conversion member) containing a phosphor.

The wavelength conversion member may include a light-transmitting material as listed above for the light-transmitting member 26 as the matrix, and a granular phosphor as the wavelength conversion substance. For example, the material of the matrix may be an epoxy resin, a silicone resin, a mixed resin thereof, or a light-transmitting material such as glass. In view of the lightfastness and the moldability of the wavelength conversion member, it is advantageous to select a silicone resin as the matrix of the wavelength conversion member.

The wavelength conversion member may include a light-diffusing substance. The light-diffusing substance may be fine particles of $SiO_2$, $TiO_2$, $Al_2O_3$, ZnO, or the like, for example.

The phosphor may be a fluoride-based phosphor such as a YAG-based phosphor, a β-SiAlON phosphor or a KSF-based phosphor, for example. One wavelength conversion member may include one or more types of phosphors. Phosphors of different types may be mixed together or layered together. For example, the light emitting element 21 that emits light of bluish color may be used, and a β-SiAlON phosphor that emits light of greenish color and a fluoride-based phosphor such as a KSF-based phosphor that emits light of reddish color may be used as phosphors. By using such two types of phosphors, it is possible to expand the color reproduction range of the light emitting module. The phosphor may be a quantum dot phosphor.

The phosphor may be in any arrangement inside the wavelength conversion member. For example, the phosphor may be distributed generally evenly, or unevenly, inside the wavelength conversion member.

The lightguide member 25, which forms a portion of the encapsulation member 24, may be a member that attaches the light emitting element 21 and the light-transmitting member 26 together. The lightguide member 25 may be light-transmitting, and may allow 60% or more, preferably 90% or more, of light emitted from the light emitting element 21 to pass therethrough. Therefore, the lightguide member 25 may include a diffuser member, or the like, or may be formed only from a light-transmitting resin material that does not include a diffuser member, or the like.

The lightguide member 25 may cover the lateral surface of the light emitting element 21 (the surface that connects the primary light emitting surface 22a and the electrode formation surface 22b together). Then, it is possible to efficiently extract light emitted in the lateral surface direction of the light emitting element 21 into the lightguide member 25, thereby increasing the emission efficiency of the light emitting module 100.

The material of the lightguide member 25 may be a light-transmitting thermosetting resin material such as an epoxy resin or a silicone resin, etc.

The reflective member 27, which forms a portion of the encapsulation member 24, may have a reflectivity of 60% or more, preferably a reflectivity of 90% or more, for light emitted from the light emitting element 21. The material of the reflective member 27 is preferably a resin material that contains a white pigment, or the like. Particularly, it is preferred to use a silicone resin that contains titanium oxide.

As shown in FIG. 2B, the light source 20 may include the metal film 28 electrically connected to the electrode 23. Such a metal film 28 may be provided on the light source 20 including the encapsulation member 24 formed of a plurality of members as shown in FIG. 2A. The material of the metal film 28 may have a layered structure including Cu/Ni/Au layered in this order, for example.

(Lightguide Plate 10)

The lightguide plate 10 is a light-transmitting plate-shaped member that receives light from the light sources 20 gives a planar light emission. The lightguide plate 10 has the first primary surface 11 to be the light emitting surface, the second primary surface 12 opposite to the first primary surface 11.

For example, the size of the lightguide plate 10 is about 1 cm to about 200 cm each side, and preferably about 3 cm to about 30 cm each side. The thickness of the lightguide plate 10 may be about 0.1 mm to about 5 mm, and is preferably 0.5 mm to 3 mm. Note that where the first primary surface 11 or the second primary surface 12 has recessed portions, protruding portions, etc., the "thickness" as used herein refers to the thickness without such portions.

The planar shape of the lightguide plate 10 may be a generally rectangular shape, a generally circular shape, etc., for example.

The material of the lightguide plate 10 may be a resin material such as a thermoplastic resin such as acrylic, polycarbonate, cyclic polyolefin, polyethylene terephthalate and polyester or a thermosetting resin such as epoxy and silicone, or an optically transparent material such as glass. A thermoplastic resin material is particularly preferred because it can be manufactured efficiently by injection molding. Among others, polycarbonate, which is highly transparent and inexpensive, is preferred. With the method of manufacturing a light emitting device of the present embodiment, where the interconnect substrate is attached after the light source 20 is attached to the lightguide plate 10, a step such as solder reflow in which a high temperature is used can be omitted, making it possible to use even a material that is thermoplastic and has a low heat resistance such as polycarbonate.

The lightguide plate 10 may be a single layer, or may include a plurality of light-transmitting layers that are layered together. When a plurality of light-transmitting layers are layered together, a layer having a different refractive index, e.g., an air layer, or the like, may be provided between any layers. Then, light may be diffused more easily, and it is possible to realize a light emitting module with reduced unevenness in luminance. Such a configuration may be realized by providing spacers between any light-transmitting layers, thereby spacing them apart and providing an air layer therebetween.

(Depressed Portion)

The lightguide plate 10 includes the recessed portion 121 on the second primary surface 12 side. The recessed portion 121 is a portion that is the target position at which the light emitting element 21 is arranged.

The size of the recessed portion 121 in a plan view may be 0.05 mm to 10 mm, for example, and is preferably 0.1 mm to 1 mm. The depth can be 0.05 mm to 4 mm, and is preferably 0.1 mm to 1 mm. The distance between the optical function portion 111 and the recessed portion 121 may be set appropriately within the range for which the optical function portion 111 and the recessed portion 121 are spaced apart from each other.

The shape of the recessed portion 121 in a plan view may be a generally rectangular shape or a generally circular shape, and can be selected based on the arrangement pitch of the recessed portions, etc. Where the arrangement pitch of the recessed portions (the distance between two most adjacent recessed portions) is generally even, a generally circular or a generally square shape is preferred. Among others, with a generally circular shape, it is possible to desirably spread light from the light source 20.

The recessed portion 121 has at least one lateral surface 121b in accordance with the shape of the recessed portion 121 in a plan view. In the light guide plate 10 shown in FIG. 1A or the like, the recessed portion 121 has one lateral surface 121b. In the case where the recessed portion 121 has a rectangular shape in a plan view, the recessed portion 121 has four lateral surfaces 121b. It is preferable that the light source 20 is placed in the recessed portion 121 of the light guide plate 10 such that the light source 20 is spaced apart from the any lateral surface(s) 121b of the recessed portion 121. In other word, the light source 20 is not in contact with the any lateral surface(s) 121b of the recessed portion 121.

The recessed portions 121 are arranged two-dimensionally as the lightguide plate 10 is seen from above. Preferably, the recessed portions 121 are arranged two-dimensionally in two orthogonal directions, i.e., the x direction (horizontal direction) and the y direction (vertical direction). As shown in FIG. 1A, the arrangement pitch in the x direction and the arrangement pitch in the y direction of the recessed portions 121 may be equal to each other or different from each other. The two directions of arrangement may not be orthogonal. The arrangement pitch in the x direction or the y direction is not limited to a regular pitch, but may be an irregular pitch. For example, the recessed portions 121 may be arranged so that the interval therebetween increases from the center toward the periphery of the lightguide plate 10. Note that the pitch between the recessed portions 121 is the distance between the centers (optical axes) of the recessed portions 121. The pitch between the recessed portions 121 may be about 0.05 mm to about 20 mm, for example, and is preferably about 1 mm to about 10 mm.

(Optical Function Portion)

The lightguide plate 10 may include the optical function portions 111 on the first primary surface 11 side. The optical function portions 111 can have the function of spreading light in the plane of the lightguide plate 10, for example.

The optical function portion 111 may be a cone-shaped or truncated cone-shaped depression provided on the first primary surface 11 side. Specifically, a cone-shaped depression may be in the shape of a cone or a polygonal pyramid such as a quadrangular pyramid or a hexagonal pyramid, and a truncated cone-shaped depression may be in the shape of a truncated cone or a truncated polygonal pyramid such as a truncated quadrangular pyramid or a truncated hexagonal pyramid. With a truncated cone-shaped depression, the size of a portion corresponding to the apex in a plan view can be 100% to 500% the size of the light source 20 in a plan view.

A material (e.g., air) having a different refractive index from the lightguide plate 10 can be placed in these depressions. A light-reflective material (e.g., a reflective film of a metal, or the like, or a white resin), etc., may be provided in the depressions. The slope of the optical function portion 111 may be straight or curved as seen in a cross section.

It is preferred that the optical function portion 111 is provided so as to correspond to the light source 20, i.e., provided at a position opposite from the light source 20 arranged on the second primary surface 12 side, as will be described below. Particularly, it is preferred that the optical axis of the light source 20 generally coincides with the optical axis of the optical function portion 111. For example, where the depression of the optical function portion 111 has a cone shape, it is preferred that the apex generally coincides with the optical axis of the light source 20. Where the depression of the optical function portion 111 has a truncated cone shape, it is preferred that the surface corresponding to the apex is located on the optical axis of the light source 20.

The size of the optical function portion 111 can be set appropriately. The optical function portion 111 shown in FIG. 1B is a truncated cone-shaped recessed portion having a circular opening on the first primary surface 11, and the diameter of the opening is larger than the light source 20 in the illustrated example.

(Attachment Member)

The attachment member 30 serves to propagate light emitted from the light source 20 to the lightguide plate 10. The attachment member 30 is a light-transmitting member that is arranged in the recessed portion 121 on the second primary surface 12 side of the lightguide plate 10. It is preferred that the size of the attachment member 30 in a plan view is equal to or smaller than the size of the bottom surface 121a of the recessed portion 121.

The attachment member 30 may be light-transmitting, and may allow 60% or more, preferably 90% or more, of light emitted from the light source 20 to pass therethrough. It is preferred that the material of the attachment member 30 has a refractive index that is generally equal to that of the material of the lightguide plate 10. For example, the material of the matrix may be an epoxy resin, a silicone resin, a mixed resin thereof, or a light-transmitting material such as glass. In view of the lightfastness and the moldability of the lightguide member 25, it is advantageous to select a silicone resin as the matrix of the attachment member 30.

(Cover Member 40)

The cover member 40 covers the lateral surfaces of the light sources 20 and the second primary surface 12 of the lightguide plate 10. Moreover, the cover member 40 is also arranged in the recessed portion 121, covering the lateral surface 121b of the recessed portion 121. It is preferable that the cover member 40 is provided between all the lateral surfaces 121b of the recessed portion 121 and all the lateral surfaces of the light sources 20 in the case where the recessed portion 121 has plurality of lateral surfaces 121b. The cover member 40 is preferably a light reflective member. When the cover member 40 is a light-reflective member, light emitted from the light source 20 may be efficiently taken into the lightguide plate 10.

The cover member 40 may have a reflectivity of 60% or more, preferably a reflectivity of 90% or more, for light emitted from the light source 20. The material of the cover member 40 is preferably a resin material that contains a white pigment, or the like. Particularly, it is preferred to use a silicone resin that contains titanium oxide. Thus, by using an inexpensive material such as titanium oxide as a material that is used in a relatively large quantity to cover the entire surface of the lightguide plate 10, it is possible to make the light emitting module 100 inexpensive.

(Metal Film)

The light emitting module 100 may include the metal film 50 that is electrically connected to the electrodes 23 of the light sources 20. The metal film 50 is arranged so as to cover both the cover member 40 and the electrode 23. The material of the metal film 50 may have a layered structure including Cu/Ni/Au layered in this order, for example.

(Interconnect Substrate)

The light emitting module 100 may include the interconnect substrate 60 as shown in FIG. 1B. The interconnect substrate 60 is a substrate that includes an insulative base 61, and the interconnect 62 electrically connected to the light sources 20, etc. With the provision of the interconnect substrate 60, it is possible to easily form complicated interconnects that are needed for local dimming, etc. The interconnect substrate 60 may be formed by attaching the interconnect 62 of the interconnect substrate 60, which is provided separately, to the metal film 50, after connecting the light sources 20 on the lightguide plate 10 and forming the cover member 40 and the metal film 50. When providing the metal film 50 to be connected to the light source 20, the metal film 50 may be formed to have a shape that is larger than the planar shape of the electrodes 23 of the light sources 20, thereby making it easy to electrically attach the interconnect substrate 60 and the light sources 20 together.

For example, the interconnect substrate 60 may include a conductive member that fills a plurality of via holes provided in the insulative base 61, and the interconnect 62 that is electrically connected to the conductive member on the opposite sides of the base 61.

The material of the base 61 of the interconnect substrate 60 may be a ceramic or a resin, for example. In view of the low cost and moldability, a resin may be selected as the material of the base 61. The resin may be a composite material such as phenolic resin, epoxy resin, polyimide resin, BT resin, polyphthalamide (PPA), polyethylene terephthalate (PET), unsaturated polyester, glass epoxy, etc. It may be a rigid substrate or a flexible substrate.

For example, the interconnect 62 may be a conductive foil (conductive layer) provided on the base 61, and may be electrically connected to a plurality of light sources 20. It is preferred that the material of the interconnect 62 has a high thermal conductivity. Examples of such a material include a conductive material such as copper, for example. The interconnect 62 may be formed by plating or conductive paste application or printing, etc., and the thickness of the interconnect 62 may be about 5 μm to about 50 μm, for example.

The interconnect substrate 60 may be attached to the lightguide plate 10, etc., by any method. For example, the attachment can be achieved by arranging and pressure-bonding a sheet-shaped adhesive sheet between the surface of the cover member 40 provided on the opposite side of the lightguide plate 10 and the surface of the interconnect substrate 60. The electric connection between the interconnect 62 of the interconnect substrate 60 and the light sources 20 may be made by any method. For example, the attachment with the metal film 50 may be made by melting the conductive member, which is a metal buried in the via holes, using pressure and heat.

Note that the interconnect substrate 60 may have a layered structure. For example, the interconnect substrate 60 may be a metal plate with an insulative layer provided on the surface thereof. The interconnect substrate 60 may be a TFT substrate having a plurality of TFTs (Thin-Film Transistors).

The light emitting module of the present disclosure may be used as a backlight of a liquid crystal display device, for example.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method for manufacturing a light emitting module comprising:
   preparing a light source including a light emitting element that has a pair of electrodes on the same surface side, and an encapsulation member that covers the light emitting element so as to expose a portion of a surface of the pair of electrodes;
   preparing a lightguide plate having a first primary surface to be a light emitting surface, and a second primary surface on an opposite side from the first primary surface, wherein the second primary surface has a recessed portion that has a bottom surface and at least one lateral surface;
   placing the light source on the bottom surface of the recessed portion with the pair of electrodes facing up so as to be spaced apart from the lateral surface of the recessed portion;
   arranging a cover member that buries a gap between the lateral surface of the recessed portion and the light source and covers the light source including the pair of electrodes;
   removing the cover member until the pair of electrodes are exposed; and
   forming a metal film electrically connected to the light emitting elements,
   wherein in the step of placing the light source, the light source is attached on the bottom surface of the recessed portion by an attachment member, and
   wherein the cover member is in contact with the attachment member.

2. The method for manufacturing a light emitting module according to claim 1, wherein a size of an opening of the recessed portion is smaller than 300% a size of the light source in a plan view.

3. The method for manufacturing a light emitting module according to claim 1, wherein a depth of an opening of the recessed portion is generally equal to or smaller than a height of the light source.

4. The method for manufacturing a light emitting module according to claim 1, wherein the encapsulation member includes a light-transmitting member and a reflective member.

5. The method for manufacturing a light emitting module according to claim 1, wherein the encapsulation member includes a wavelength conversion member.

6. The method for manufacturing a light emitting module according to claim 1, wherein a size of the attachment member in a plan view is equal to a size of the bottom surface of the recessed portion.

7. The method for manufacturing a light emitting module according to claim 1, wherein a size of the attachment member in a plan view is smaller than a size of the bottom surface of the recessed portion.

8. The method for manufacturing a light emitting module according to claim 1, wherein the cover member is a light reflective member.

9. The method for manufacturing a light emitting module according to claim 1, wherein the cover member has a reflectivity of 60% or more for light emitted from the light source.

10. The method for manufacturing a light emitting module according to claim 1, wherein the cover member is in contact with the bottom surface of the recessed portion.

11. The method for manufacturing a light emitting module according to claim 1, wherein the lightguide plate has a depression having a cone shape or a truncated cone shape on the first primary surface.

12. The method for manufacturing a light emitting module according to claim 11, wherein a material having a different refractive index from the lightguide plate is placed in the depression.

13. The method for manufacturing a light emitting module according to claim 11, wherein a light-reflective material is placed in the depression.

14. The method for manufacturing a light emitting module according to claim 11, wherein a slope of the depression is straight or curved in a cross section.

15. The method for manufacturing a light emitting module according to claim 11, wherein the depression has a circular opening on the first primary surface, and a diameter of the opening is larger than the light source.

16. The method for manufacturing a light emitting module according to claim 1, wherein:
   the lightguide plate has a plurality of the recessed portions on the second primary surface,
   a plurality of the light sources are placed in the respective recessed portions, and
   the method further comprises bonding the metal film and an interconnect of an interconnect substrate together so that the plurality of the light sources are driven independently by the interconnect.

17. The method for manufacturing a light emitting module according to claim 1, wherein:
   the lightguide plate has a plurality of the recessed portions on the second primary surface and is divided into a plurality of areas,
   a plurality of the light sources are placed in the respective recessed portions, and
   the method further comprises bonding the metal film and an interconnect of an interconnect substrate together so that the plurality of the light sources are divided into a plurality of groups each of which corresponds to one area of the lightguide plate and the plurality of the light sources are electrically connected in series or in parallel in each of the groups.

* * * * *